US006544063B2

United States Patent
Cadio

(10) Patent No.: US 6,544,063 B2
(45) Date of Patent: Apr. 8, 2003

(54) RESILIENT FASTENER FOR SECURING A PRINTED CIRCUIT BOARD

(75) Inventor: Michel A. Cadio, Indianapolis, IN (US)

(73) Assignee: Thomson Licensing, S.A., Boulogne-Billancourt (FR)

( * ) Notice: Subject to any disclaimer, the term of this patent is extended or adjusted under 35 U.S.C. 154(b) by 0 days.

(21) Appl. No.: 09/808,541

(22) Filed: Mar. 14, 2001

(65) Prior Publication Data
US 2002/0132508 A1 Sep. 19, 2002

(51) Int. Cl.[7] ................................................ H01R 13/62
(52) U.S. Cl. ....................................................... 439/327
(58) Field of Search ................................. 439/327, 328, 439/329, 345, 567; 361/753, 758, 759, 801, 802, 807

(56) References Cited

U.S. PATENT DOCUMENTS

| 2,227,761 | A | * | 1/1941 | Roethel ........................... 24/73 |
| 3,744,009 | A | | 7/1973 | Teagno et al. ............... 439/329 |
| 3,836,885 | A | | 9/1974 | Larsile ........................ 439/341 |
| 4,054,348 | A | | 10/1977 | Stroupe et al. .............. 439/329 |
| 4,072,387 | A | | 2/1978 | Sochor ........................ 439/329 |
| 4,938,701 | A | | 7/1990 | Heberling ...................... 439/65 |
| 5,035,641 | A | | 7/1991 | Van-Santbrink et al. .... 439/329 |
| 5,263,868 | A | | 11/1993 | Renn et al. .................... 439/67 |
| 5,267,125 | A | * | 11/1993 | Liu ............................. 361/816 |
| 5,336,095 | A | | 8/1994 | Walburn et al. .............. 439/67 |
| 5,590,023 | A | | 12/1996 | Hernandez et al. ......... 361/683 |
| 5,993,247 | A | | 11/1999 | Kidd ........................... 439/495 |
| 6,039,612 | A | | 3/2000 | Brown et al. ............... 439/716 |
| 6,233,156 | B1 | * | 5/2001 | Liao ............................ 361/759 |
| 6,327,160 | B1 | * | 12/2001 | Liao ............................ 361/801 |
| 6,354,858 | B1 | * | 3/2002 | Cooper et al. .............. 439/327 |

* cited by examiner

Primary Examiner—Javaid Nasri
(74) Attorney, Agent, or Firm—Joseph S. Tripoli; Robert D. Shedd

(57) ABSTRACT

An apparatus for securing a printed circuit board (PCB) to an enclosure, comprising: a flexible fastener having a first pair of hooks extending from two side walls for slidably engaging with a plurality of apertures in a floor of the enclosure, two spring members extending from a front wall for exerting forward pressure, and two longitudinal members extending from a back wall of the flexible fastener, each of the longitudinal members having a snapping lock for snapping the flexible fastener into place.

14 Claims, 6 Drawing Sheets

RESILIENT FASTENER FOR SECURING A PRINTED CIRCUIT BOARD

FIELD OF THE INVENTION

The invention relates to the securing of a printed circuit board in general, and, more particularly, the invention relates to an apparatus for securing a printed circuit board to an enclosure.

BACKGROUND OF THE DISCLOSURE

The current trend in the electronics industry when working on a printed circuit board (PCB) is to secure the PCB to a structure via screws. This process is very labor intensive and/or adds additional steps to the manufacturing process. For instance, either through automation or manual intervention the PCB is placed in a structure, screws are attached to the sides of the PCB for joining the PCB to the structure. The number of screws used can vary based on the level of attachment required. Unfortunately, space constraints do not always allow the use of screws to secure the PCB to a structure. Additionally, the screws can damage the PCB. Another approach to securing the PCB to a structure is to create a custom bracket for securing the PCB in the enclosure. However, different sized PCB can not be accommodated with out custom designing a bracket for each size PCB.

Therefore, a need exists in the art for a fastening arrangement that provides for easy insertion and removal of a fastener for securing the PCB and accommodating various sized PCBs.

SUMMARY OF THE INVENTION

The disadvantages associated with the prior art are overcome by an apparatus for securing a printed circuit board (PCB) to an enclosure. In an embodiment of the invention, a resilient fastener cooperates with the PCB to secure the PCB and cooperates with a plurality of apertures disposed on the floor of an enclosure. The resilient fastener comprises a plurality of hooks that slidably engage with the enclosure to pass under the floor of the enclosure, a pair of spring members for gripping the PCB and a pair of snapping locks for locking the resilient fastener in place.

Further embodiments of the present invention will become apparent from the detailed description contained hereinafter. It should be understood, however, that the detailed description and specific examples are given by way of illustration only, since various changes and modifications within the spirit and scope of the invention will become apparent to those skilled in the art from this detailed description.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
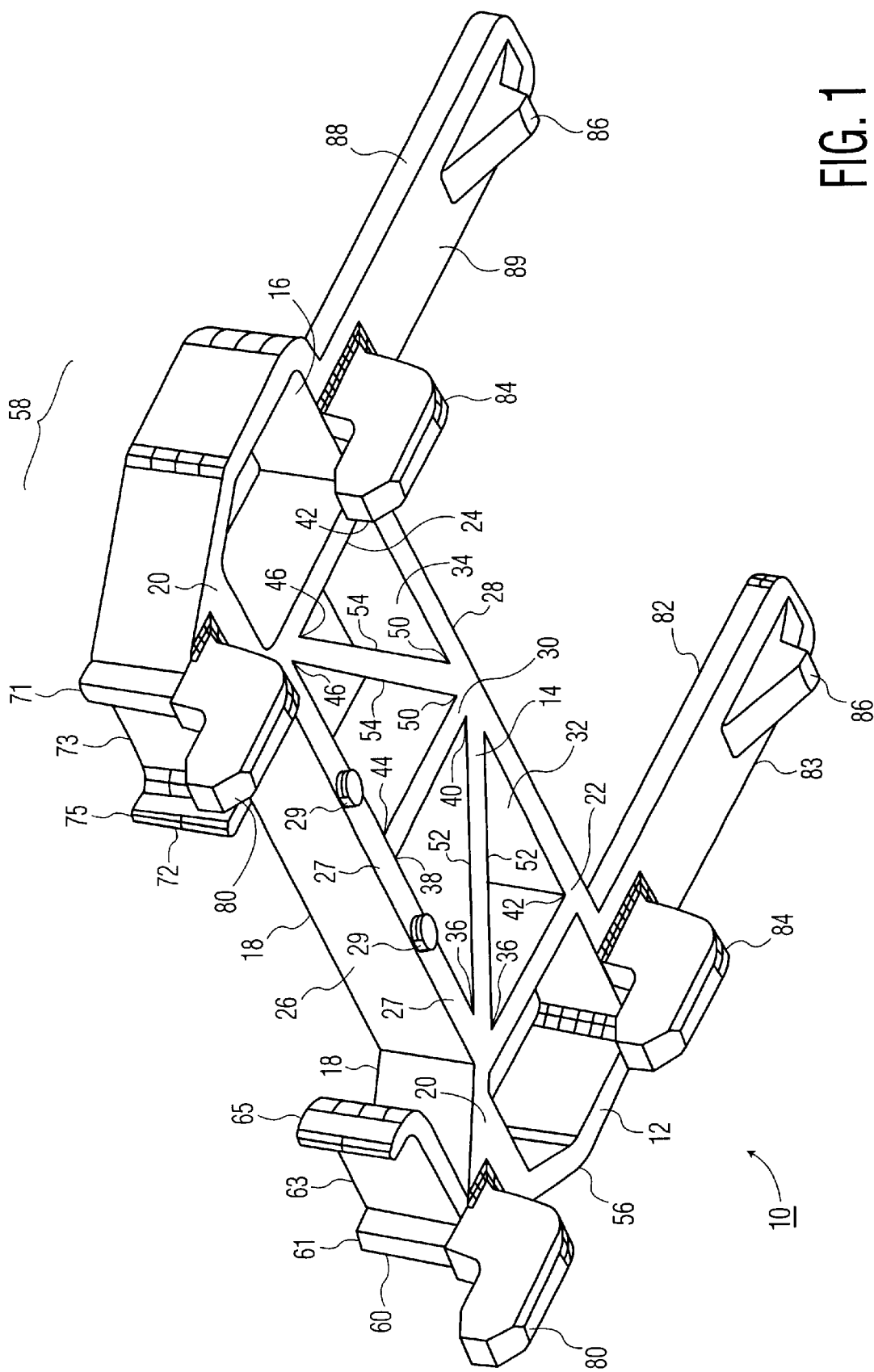
FIG. 1 illustrates a perspective view of a resilient fastener according to an embodiment of the present invention.

FIG. 1 illustrates a resilient fastener 10 according to an embodiment of the present invention. Specifically, the resilient fastener 10 comprises a substantially rectangular first end 12, a substantially rectangular center portion 14, a substantially rectangular second end 16 an open top 18 and an opposing open bottom 20. It will be appreciated by those skilled in the art that first end 12, center portion 14 and second end 16 may also be formed using non-rectangular shapes. Moreover, it will be appreciated that while the resilient fastener 10 of FIG. 1 is described primarily in rectangular and other specific shapes, various modifications to such shapes are contemplated by the inventor and within the scope of the present invention.

More specifically, center portion 14 comprises a first side wall 22, a second side wall 24, a front wall 26 and a back wall 28. A center wall 30 extends from front wall 26 to back wall 28 proximate the center of the front wall 26 and back wall 28 forming a first rectangle 32 and a second rectangle 34. The first rectangle 32 has a first corner 36, a second corner 38, a third corner 40 and a fourth corner 42. The second rectangle 34 has a first corner 44, a second corner 46, a third corner 48 and a fourth corner 50. Third corner 40 of first rectangle 32 and fourth corner 50 of second rectangle 34 are adjacent to each other. A first bracing wall 52 within first rectangle 32 extends diagonally from first corner 36 to third corner 40. A second bracing wall 54 within second rectangle 34 extends diagonally from second corner 46 to fourth corner 50.

It will be appreciated by those skilled in the art that first bracing wall 52 and second bracing wall 54 can be placed at corners other than from first corner 36 to third corner 40 and from second corner 46 to fourth corner 50.

Disposed on a bottom surface 27 of front wall 26 is a plurality of bumps 29. The plurality of bumps 29 provide additional stability for flexible fastener 10 by preloading flexible retainer 10 against a floor.

First bracing wall 52, second bracing wall 54 and center wall 30 provide structural support for resilient fastener 10 and distribute pressure through out resilient fastener 10.

First end 12 comprises a first end wall 56 opposite the first side wall 22. Back wall 28 extends from first side wall 22 to first end wall 56. Extending from first end wall 56 and first side wall 22 is a first coupling member 58 which is coupled to a first spring member 60. First spring member 60 is shaped in the form of a U. It will be appreciated by those skilled in the art that other shapes may be used with the invention and still fall within the scope of the invention.

Figure 2:
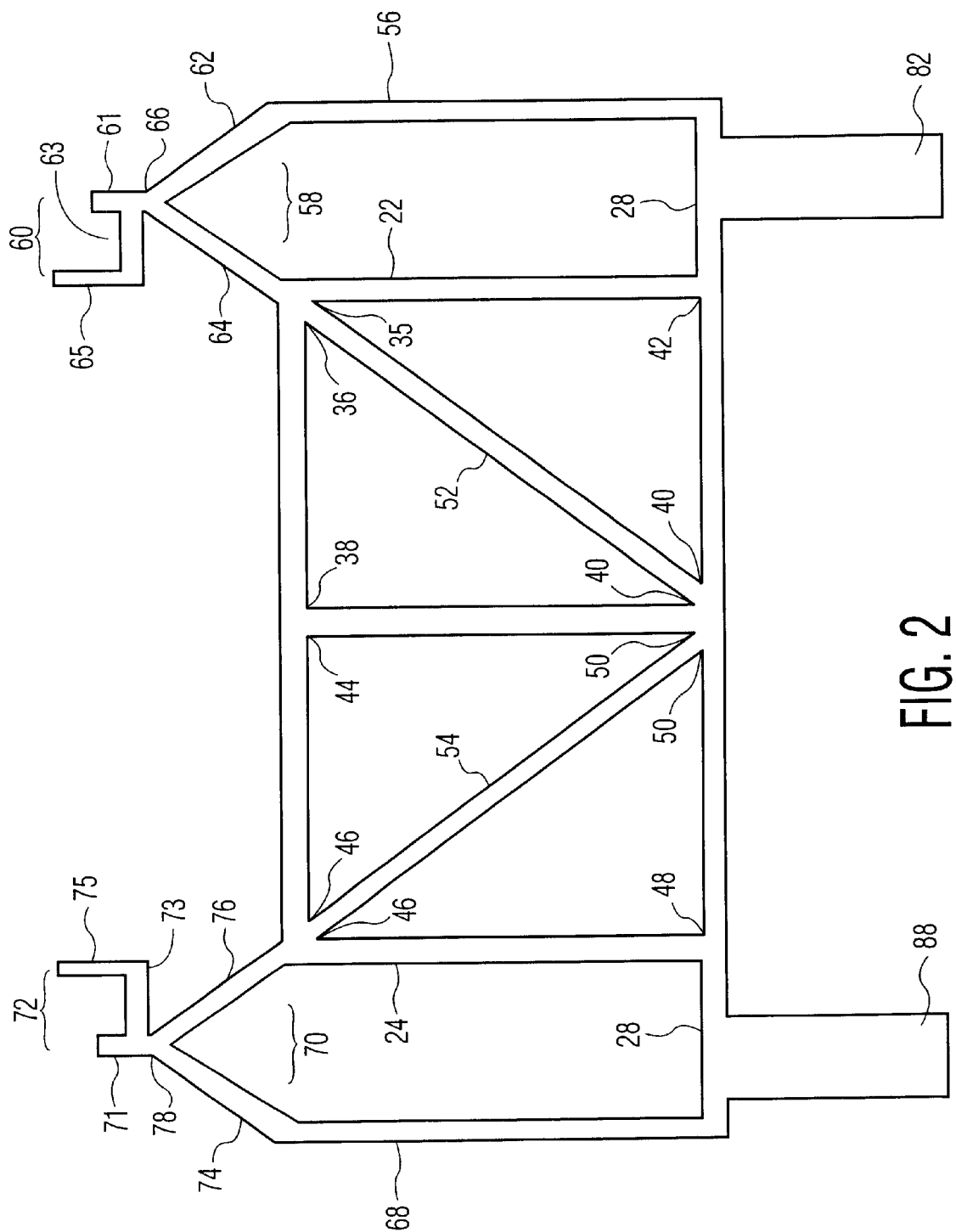
FIG. 2 depicts a top view of the resilient fastener.

First coupling member 58 further comprises first member 62 and second member 64 (see FIG. 2). First member 62 extends diagonally from first end wall 56. Second member 64 extends diagonally from first side wall 22. Second member 64 and first member 62 meet at a point 66. First spring member 60 is coupled to first coupling member 58 at the point 66.

More specifically, first spring member 60 comprises a first finger 61, a second finger 65 and a connecting member 63 coupled to first finger 61 and second finger 65 such that a U shape is formed. First finger 61 has a curvature, is flexible and shorter than second finger 65. Second finger 65 is non-flexible and straight. The connecting member 63 is coupled to the first coupling member 58 at the point 66. Second end 16 comprises a second end wall 68 opposite a second side wall 24. Back wall 28 extends from second side wall 24 to second end wall 68. Extending from second end wall 68 and second side wall 24 is a second coupling member 70 which is coupled to a second spring member 72. Second spring member 72 is shaped in the form of a U.

Second coupling member 70 further comprises third member 74 and fourth member 76 (see FIG. 2). Third member 74 extends diagonally from second end wall 68. Fourth member 76 extends diagonally from second side wall 24. Third member 74 and Fourth member 76 meet at a point 78. Second spring member 72 is coupled to second coupling member 70 at the point 78. Each one of a first pair of hooks 80 is coupled to the bottom of respective points 66 and 78.

More specifically, second spring member 72 comprises a third finger 71, a fourth finger 73 and a connecting member 75 coupled to third finger 71 and fourth finger 73 such that a U shape is formed. Third finger 71 has a curvature, is flexible and longer than fourth finger 73. Third finger 73 is non-flexible and straight. The connecting member 75 is coupled to the first coupling member 70 at the point 78.

When flexible retainer 10 is placed against an edge of a printed circuit board (PCB), first finger 61 and third finger 71 are in contact with the edge of the PCB. First finger 61 and third finger 71 are flexible so that the fingers bend closing the gap between the PCB and second finger 63 and fourth finger 73 such that are first finger 61, second finger 63, third finger 71 and fourth finger 73 contact the edge of the PCB evenly. Pressure is exerted by the flexible retainer 10 on the edge of the PCB via first finger 61 and second finger 71.

Figure 3:
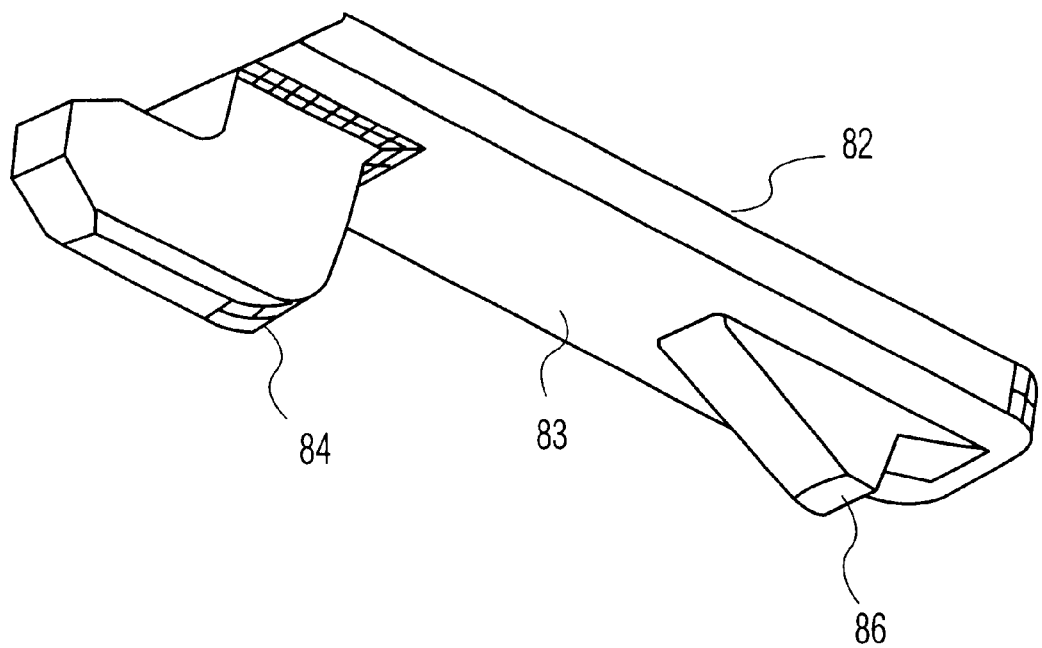
FIG. 3 depicts a perspective view of one of a second pair of hooks and a snap lock disposed on a first longitudinal member.

FIG. 3 depicts a perspective view of one of a second pair of hooks 84 and a snap lock 86 disposed on a first longitudinal member 82. Specifically, the first longitudinal member 82 extends from the back wall 28 of first end 12. On the bottom surface 83 of first longitudinal member 82 one of a second pair of hooks 84 is disposed proximate the back wall 28. One of a pair of snapping locks 86 is also disposed on the bottom surface of the longitudinal member 82 proximate an end opposing said one of a second pair of hooks 84.

Figure 4:
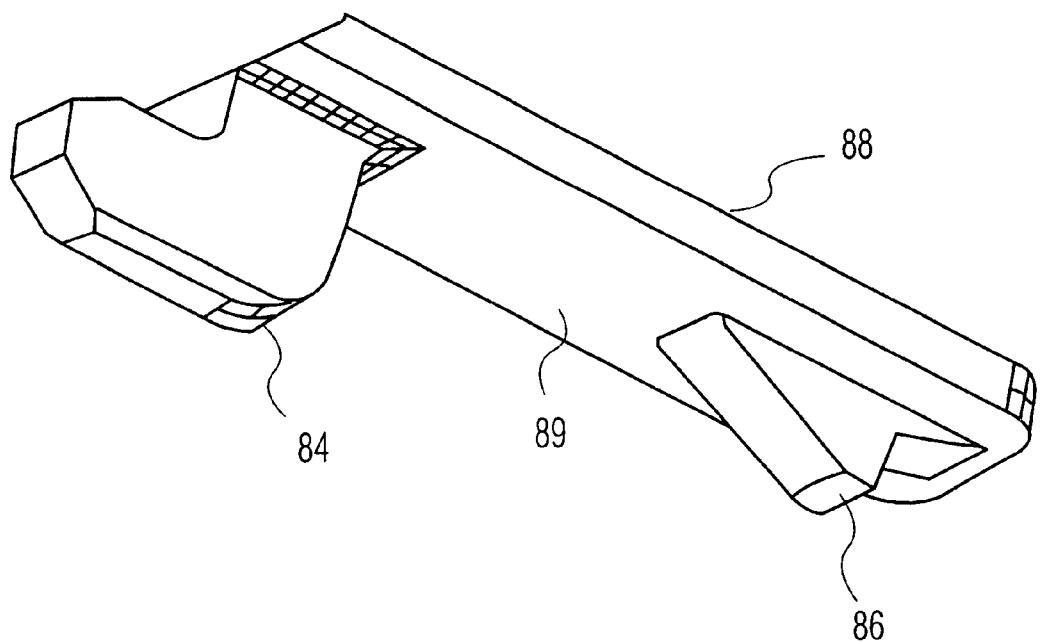
FIG. 4 depicts a perspective view of one of a second pair of hooks and a snap lock disposed on a second longitudinal member.

FIG. 4 depicts a sectional view of one of a second pair of hooks 84 and a snap lock 86 disposed on a second longitudinal member 88. Specifically, a second longitudinal member 88 extends from the back wall 28 of second end 16. On the bottom surface 89 of second longitudinal member 88 one of a second pair of hooks 84 is disposed proximate the back wall 28. One of a pair of snapping locks 86 is also disposed on the bottom surface 89 of the second longitudinal member 88 proximate an end opposing said one of a second pair of hooks 84. Having a pair of snapping locks conforms with the UL 6500 regarding double fixation of components. In case one of the pair of snapping locks 86 breaks, the remaining snapping lock will still lock flexible retainer 10 in place.

The pair of snapping locks 86 also provides stability to flexible retainer 10. The snapping feature avoids the vibration of flexible retainer against a floor of an enclosure.

Figure 5:
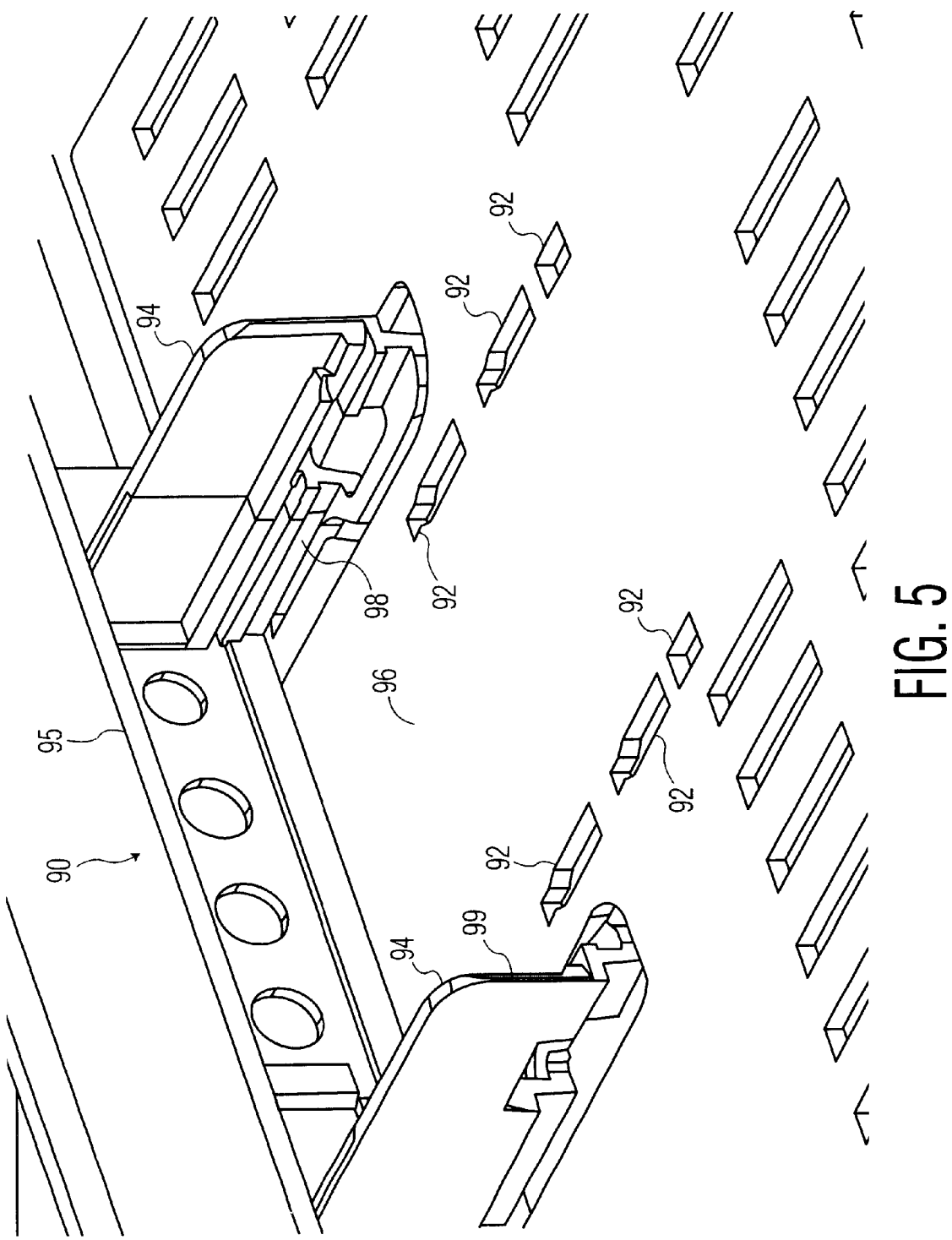
FIG. 5 depicts an enclosure having a plurality of apertures.

Although the flexible fastener 10 of FIG. 1 is preformed out of plastic, it is understood by those skilled in the art that flexible fastener 10 can be made of any non-conductive material. However, if flexible fastener 10 is made out a conductive material, flexible fastener 10 can be coated with a non-conductive material. FIG. 5 depicts an enclosure 90 having a plurality of apertures 92. Specifically, FIG. 5 depicts an enclosure 90 having at least two side walls 94, a back wall 95 and a planar floor 96. Disposed on the floor 96 of the enclosure 90 is a plurality of apertures 92. The plurality of apertures are structured and arranged to slidably engage first pair of hooks 80, second pair of hooks 84 and the pair of snapping locks 82. The pair of snapping locks 82 lock resilient fastener 10 in place in the forward direction. Extending from one of the at least two side walls 94 are two elongated support benches 98 for supporting a PCB 100. The at least two side walls 94 can be fitted into the plurality of apertures 92 or can be coupled to the floor 96 of the enclosure 90, for example, by welding.

Although the plurality of apertures 92 is depicted as slots, it will be appreciated by those skilled in the arts that other types of apertures such as holes and the like may be used.

It will also be appreciated by those skilled in the art that the invention can be used with an enclosure having no walls. The flexible retainer 10 uses the floor for support and not walls for support. Walls can be used as an additional means of support for a PCB.

Figure 6:
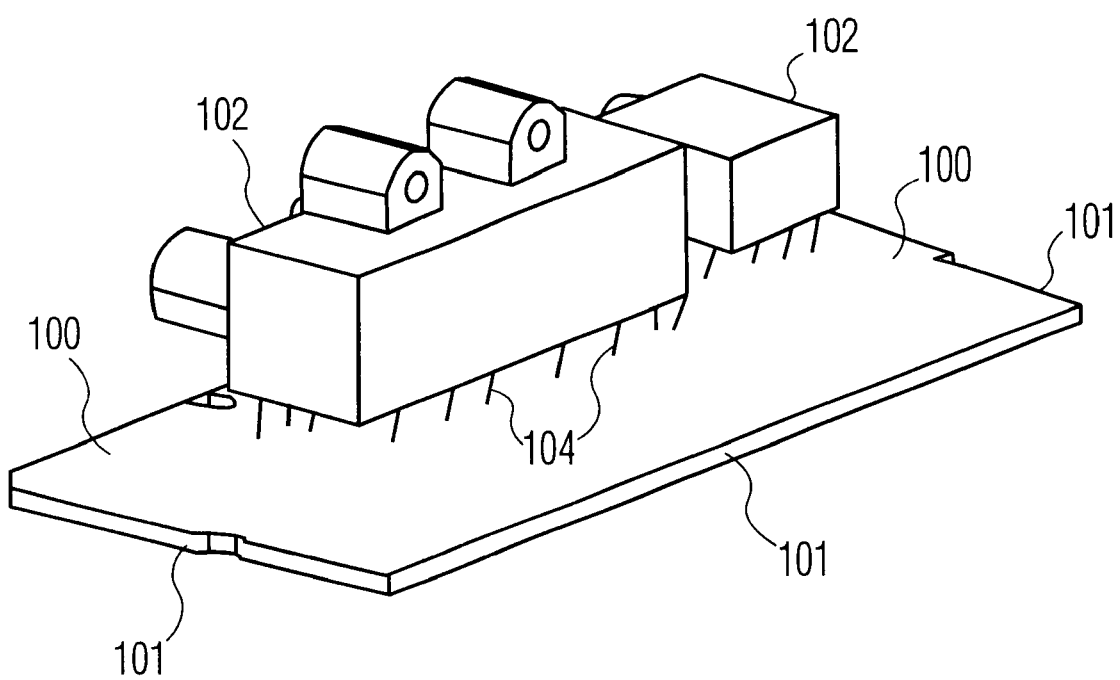
FIG. 6 depicts an isometric view of electronic components mounted to a printed circuit board (PCB)

FIG. 6 depicts an isometric view of electronic components 102 mounted to the printed circuit board (PCB) 100. Electronic components 102 comprise, for example, an integrated circuit, digital tuner, RF modulator and the like. Leads 104 are coupled to the electronic components 102 and extend outward for attachment to PCB 100. PCB 100 has an edge 101 for allowing spring members 60, 72 of resilient fastener 10 to contact the PCB 100. Resilient fastener 10 can accommodate different sized PCB boards with out the need to modify flexible retainer 10.

Figure 7:
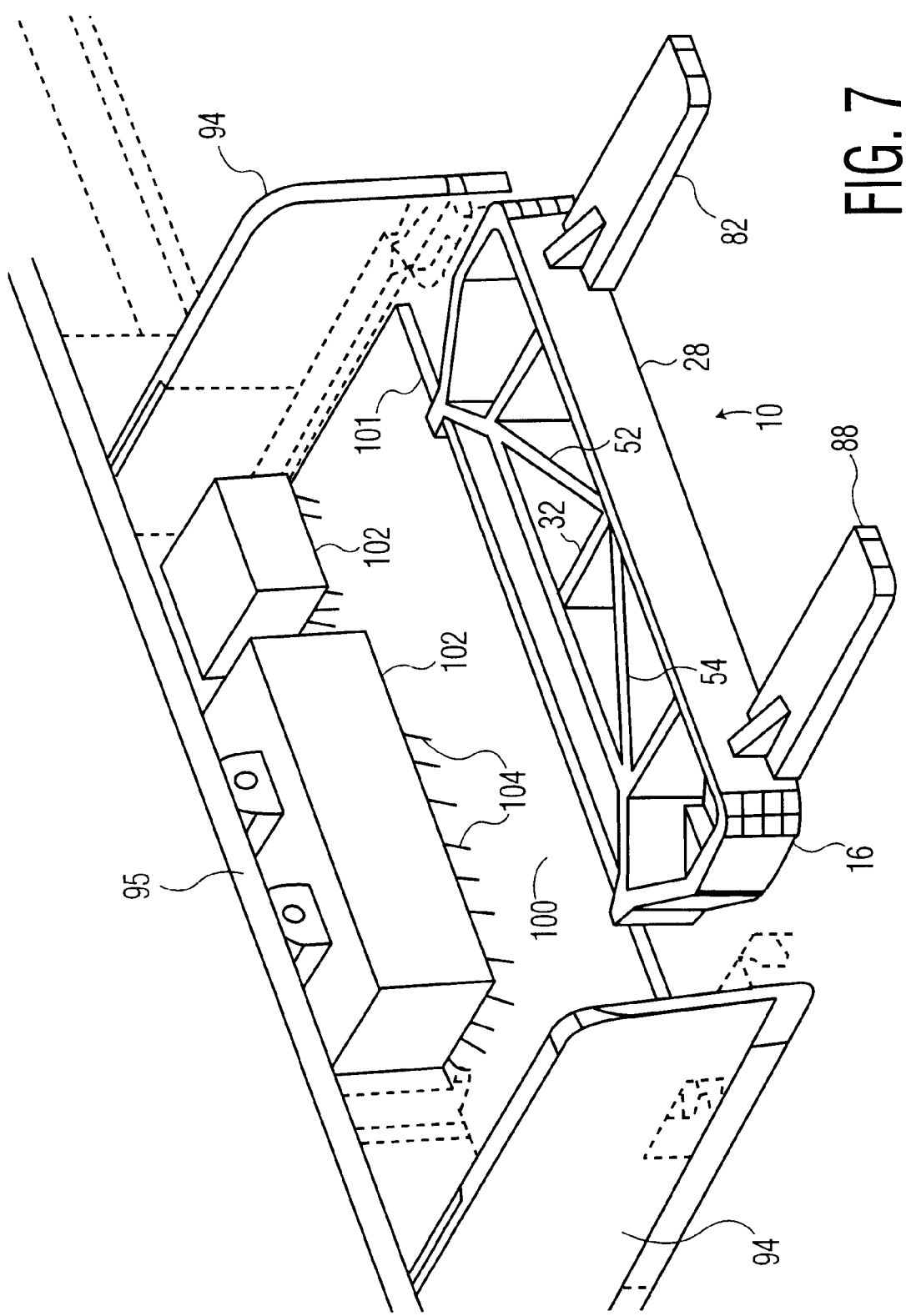
FIG. 7 depicts an assembly including resilient fastener according to an embodiment of the present invention.

FIG. 7 depicts an assembly including resilient fastener 10 according to an embodiment of the present invention. Specifically, FIG. 7 depicts an isometric view of a structure comprising enclosure 90 with a PCB 100 having electronic components 102 disposed thereon. The flexible retainer's 10 first pair of hooks 80, second pair of hooks 84 and pair of snapping locks 86 are exchanged with the plurality of apertures on the floor 96 of enclosure 90. Spring members 60, 72 are in contact with the PCB edge 101.

The combination of precisely aligned spring members 60, 72 with the PCB 100, the engagement of first pair of hooks 80, second pair of hooks 84 and the locking of the pair of snapping locks 86 with a plurality of apertures 92 assure a uniform pressure between PCB 100 and resilient fastener 10. The uniform pressure is reproducible even after multiple quick-connects and quick-disconnects of the resilient fastener 10 from the enclosure 90.

The resilient fastener 10 may be disengaged from the PCB 100 and enclosure 90 with one hand only and with no special tooling, by exerting a lateral force directed away from the PCB edge 101 and lifting resilient fastener upward. Repeated quick-connects and quick disconnects can be made with the resilient fastener with relatively low impact force upon the PCB edge 101. Hence, there is a low probability of damaging the PCB 100.

By adjusting the spacing of the plurality of apertures 92 and installing the resilient fastener 10 in apertures closer to the PCB 100 the pressure exerted on the PCB can be increased. On the contrary installing resilient fastener 10 into apertures further away from the PCB 100 will reduce the pressure exerted on the PCB. Thus PCBs of different thicknesses can be accommodated. For instance PCBs as thin as about 0.044 inches and about as thick as 0.067 inches can be accommodated by the resilient fastener 10.

Thus, as described, the present invention provides for the enhanced securing of a PCB 100 to an enclosure 90 with out requiring the use of screws or the design of customized components for securing the PCB 100 to the enclosure 90. By utilizing an arrangement whereby spring members exert forward pressure on a PCB and the resilient fastener 10 is secured to the enclosure 90 with hooks and snapping locks, the present invention provides for the securing of various sized PCBs and allows for easy removal and insertion of the resilient fastener 10.

Although various embodiments which incorporate the teachings of the present invention have been shown and described in detail herein, those skilled in the art can readily devise many other varied embodiments that still incorporate these teachings.

What is claimed is:

1. A printed circuit board fastener comprising:
    a flexible fastener having a first pair of hooks extending from a bottom of two side walls, two spring members extending from a front wall and two longitudinal members extending from a back wall of said flexible fastener, each of said longitudinal members having a snapping lock and each one of a second pair of hooks disposed on a bottom surface of said longitudinal members; and
    features for securing the PCB to an enclosure.

2. The printed circuit board fastener of claim 1, wherein the features for securing the PCB to the enclosure comprises said first and second pair of hooks slidably engaging with a plurality of apertures disposed in the enclosure to pass under a floor of the enclosure.

3. The printed circuit board of claim 1, wherein the features for securing the PCB to the enclosure comprises said snapping locks being snapped into place within the plurality of apertures disposed in the enclosure.

4. The printed circuit board fastener of claim 1, wherein the features for securing the PCB to the enclosure comprises said spring members exerting forward pressure on said PCB.

5. The printed circuit board fastener of claim 1, wherein the features for securing the PCB to the enclosure comprises having a plurality of bumps disposed on a bottom surface of said front wall for pre-loading the fastener on the floor of the enclosure.

6. The printed circuit board fastener of claim 1, wherein said flexible fastener is composed of plastic material.

7. The printed circuit board fastener of claim 1, wherein said flexible fastener comprises a center wall extending from said front wall to said side back wall.

8. The printed circuit board fastener of claim 1, wherein the flexible fastener comprises a bracing wall extending diagonally from a corner of said front wall to a corner of said center wall.

9. An apparatus for securing a printed circuit board (PCB) to an enclosure, said apparatus comprising:
    a flexible fastener having a first pair of hooks extending from two side walls for slidably engaging with a plurality of apertures in a floor of said enclosure; two spring members extending from a front wall for exerting forward pressure on said PCB; and two longitudinal members extending from a back wall of said flexible fastener, each of said longitudinal members having a snapping lock for snapping the flexible fastener into place within said plurality of apertures in said enclosure.

10. The apparatus of claim 9 further comprising a second pair of hooks where each one of said second pair of hooks is disposed on each one of said longitudinal members for slidably engaging with the plurality of apertures in the floor of said enclosure.

11. The apparatus of claim 9 further comprising a plurality of bumps disposed on a bottom surface of said front wall for pre-loading the flexible fastener on the floor of the enclosure.

12. The apparatus of claim 9 further comprising a center wall extending from said front wall to said back wall.

13. The apparatus of claim 9 further comprising a bracing wall extending diagonally from a corner of said front wall to a corner of said center wall, for adding structural support to the flexible fastener.

14. The apparatus of claim 9 wherein said flexible fastener is comprised of plastic.

* * * * *